(12) United States Patent
Kim

(10) Patent No.: US 6,258,722 B1
(45) Date of Patent: Jul. 10, 2001

(54) METHOD OF MANUFACTURING CMOS DEVICE

(75) Inventor: Jae Whan Kim, Kyoungki-do (KR)

(73) Assignee: Hyundai Eletronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/473,471

(22) Filed: Dec. 28, 1999

(30) Foreign Application Priority Data

Dec. 30, 1999 (KR) .............................. 1998-61852

(51) Int. Cl.$^7$ ................................ H01L 21/311
(52) U.S. Cl. ..................... 438/702; 438/706; 438/723
(58) Field of Search ................... 438/700, 702, 438/706, 723, 689, 223, 224, 430

(56) References Cited

U.S. PATENT DOCUMENTS

| | | | |
|---|---|---|---|
| 4,740,827 | * 4/1988 | Niitsu et al. | 357/42 |
| 5,179,038 | 1/1993 | Kinney et al. | 437/78 |
| 5,489,795 | * 2/1996 | Yoshimura et al. | 257/369 |
| 5,612,242 | 3/1997 | Hsu | 437/56 |
| 5,861,330 | 1/1999 | Baker et al. | 438/232 |
| 5,877,066 | * 3/1999 | Stolmeijer et al. | 438/424 |
| 6,046,079 | * 4/2000 | Ko et al. | 438/223 |

FOREIGN PATENT DOCUMENTS 4263467  9/1992 (JP) .

* cited by examiner

Primary Examiner—Benjamin L. Utech
Assistant Examiner—Kin-Chan Chen
(74) Attorney, Agent, or Firm—Selitto, Behr & Kim

(57) ABSTRACT

A method of manufacturing a CMOS device which can prevent latch-up and easily apply to high integration device by completely isolating a N well and a P well in the back side of a substrate, is disclosed. A method of manufacturing a CMOS device according to the present invention, includes the steps of: providing a semiconductor having a back side and a front side, and including a N well and a P well formed therein respectively, a NMOS transistor formed on the P well, a PMOS transistor formed on the N well; etching the back side of the substrate along the PN junction portions of the N well and the P well to the front side of the substrate, thereby forming trenches; and, forming an insulating layer on the back side of the substrate to fill the trenches, thereby isolating the P well and the N well. Furthermore, a method of manufacturing a CMOS device according to the present invention, further includes the steps of: etching the insulating layer to expose portions of the P well and N well, thereby forming contact holes; forming a metal layer on the insulating layer to fill the contact holes; and patterning the metal layer to form an interconnection line.

4 Claims, 4 Drawing Sheets

METHOD OF MANUFACTURING CMOS DEVICE

BACKGROUND OF THE INVENTION

1. Field of the Invention

The present invention relates to a method of manufacturing a semiconductor device, and more particularly to a method of manufacturing a CMOS device capable of isolating a N well and a P well in back side of a substrate.

2. Description of the Related Art

A complementary metal oxide semiconductor(CMOS) device has a combination structure of a N-channel MOS (NMOS) transistor and a P-channel MOS(PMOS) transistor. This CMOS device has the advantage of a low power consumption compared with a single device such as a NMOS or a PMOS transistor, since DC voltage between power supply terminals is very low. Therefore, the CMOS device is appropriated for low power, high speed and high integration devices.

When manufacturing the CMOS device, for forming NMOS and PMOS transistors respectively, a N well and a P well are necessarily formed. Furthermore, the N well and the P well are isolated by PN junction.

However, in the above CMOS device, a parasitic thyristor exists due to PNPN junction. Therefore, in case voltage is extremely applied to an input terminal of the CMOS device due to noise of power supply voltage, the parasitic thyristor is turned-on. As a result, current extremely flows in the CMOS device, so that the CMOS device is broken. This occurrence is "latch-up".

SUMMARY OF THE INVENTION

It is therefore an object of the present invention to provide a method of manufacturing a CMOS device which can prevent latch-up and easily apply to high integration device by completely isolating a N well and a P well in the back side of a substrate, for solving the problems in the conventional art.

To accomplish this above object, a method of manufacturing a CMOS device according to the present invention, includes the steps of: providing a semiconductor having a back side and a front side, and including a N well and a P well formed therein respectively, a NMOS transistor formed on the P well, a PMOS transistor formed on the N well; etching the back side of the substrate along the PN junction portions of the N well and the P well to the front side of the substrate, thereby forming trenches; and forming an insulating layer on the back side of the substrate to fill the trenches, thereby isolating the P well and the N well.

Furthermore, a method of manufacturing a CMOS device according to the present invention, further includes the steps of: etching the insulating layer to expose the P well and the N well, thereby forming contact holes; forming a metal layer on the insulating layer to fill the contact holes; and patterning the metal layer to form an interconnection line.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiments of the present invention will be explained with reference to accompanying drawings.

Figure 1A:
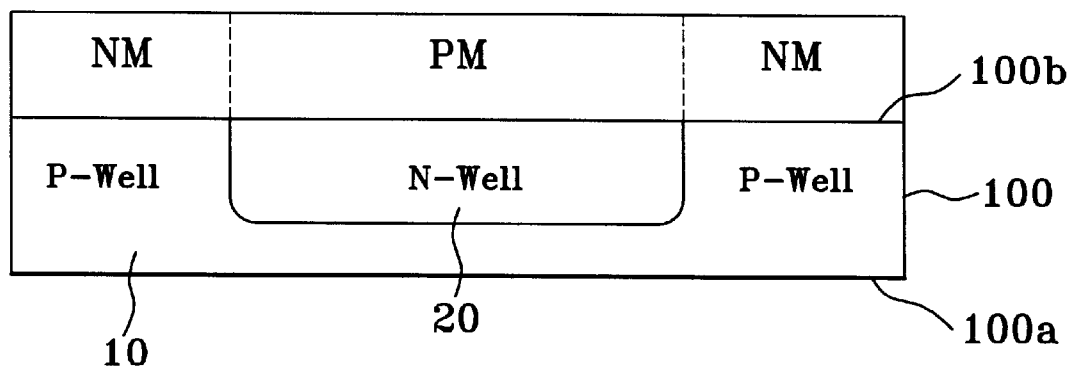
FIG. 1A to 1B are cross sectional views describing a method of manufacturing a CMOS device according to one embodiment of the present invention.
Figure 1B:
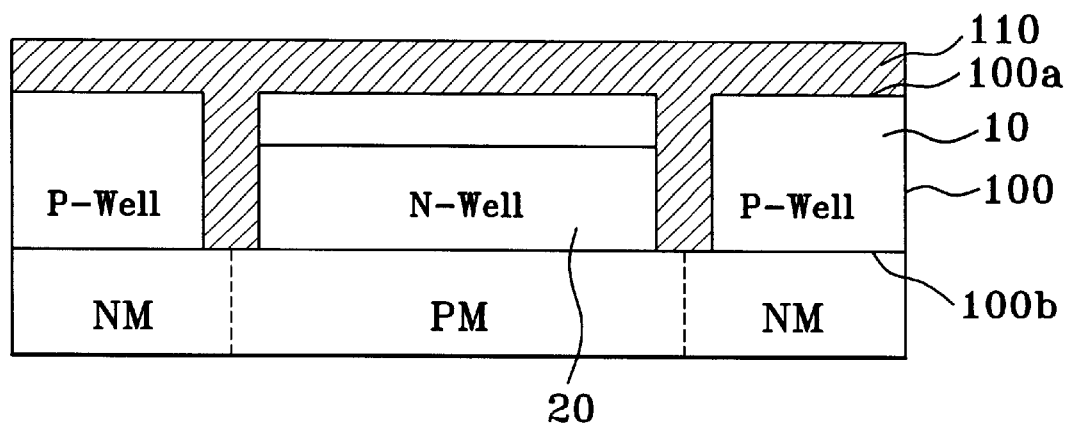

FIG. 1A and FIG. 1B are cross sectional views describing a method of manufacturing a CMOS device according to one embodiment of the present invention.

Referring to FIG. 1A, a semiconductor substrate 100 having a back side 100a and a front side 100b is provided. A P well 10 and a N well 20 are formed in the substrate 100, respectively. In the front side 100b of the substrate 100, a NMOS transistor NM is formed on the P well 10 and a PMOS transistor PM is formed on the N well 20. An isolation layer formed between the NMOS and PMOS transistors PM and NM in a conventional CMOS device is not required, because a trench which will be formed later can be served as an isolation layer.

Referring to FIG. 1B, in the back side 100a of the substrate 100, the substrate 100 along the PN junctions is etched to the front side 100b, thereby forming trenches. Thereafter, an insulating layer 110 is formed on the back side 100a of the substrate 100, so as to fill the trenches, thereby isolating the P well 10 and the N well 20.

Figure 2:
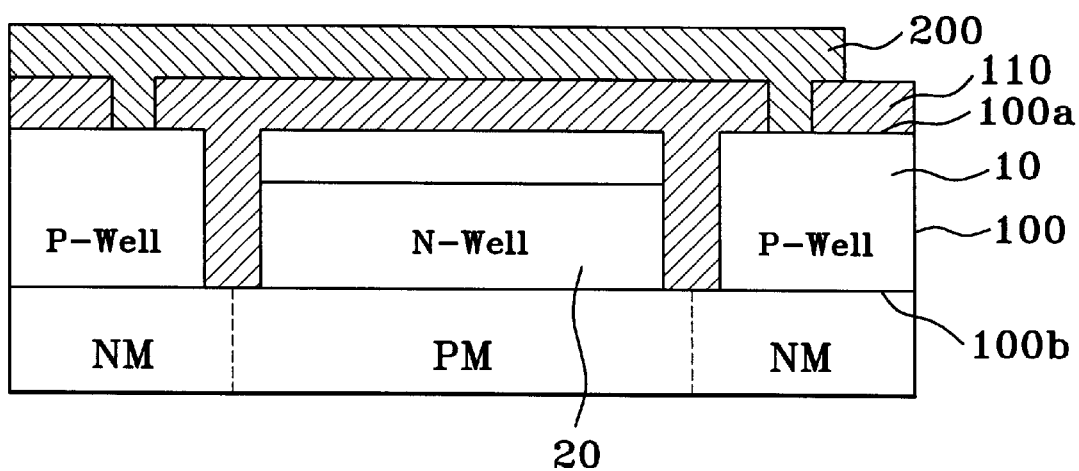
FIG. 2 is a cross sectional view describing a method of forming a metal layer of the CMOS device shown in FIG. 1A to FIG. 1B.

Referring to FIG. 2, after forming the insulating layer 110 (refer to FIG. 1B), the insulating layer 110 is etched to expose portions of the P well 10, thereby forming contact holes. Next, a metal layer is deposited on the insulating layer 110 to fill the contact holes. The metal layer is then patterned to form an interconnection line 200.

As described above, the interconnection line 200 is formed on the back side 100a of the substrate 100, so that a process of forming a interconnection line can be easily performed.

Figure 3A:
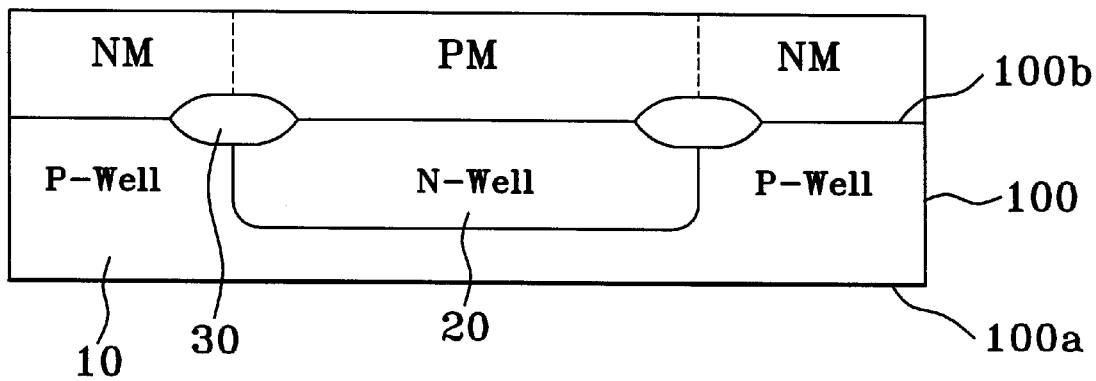
FIG. 3A, 3B, and 3C are cross sectional views describing a method of manufacturing a CMOS device according to the other embodiment of the present invention.
Figure 3B:
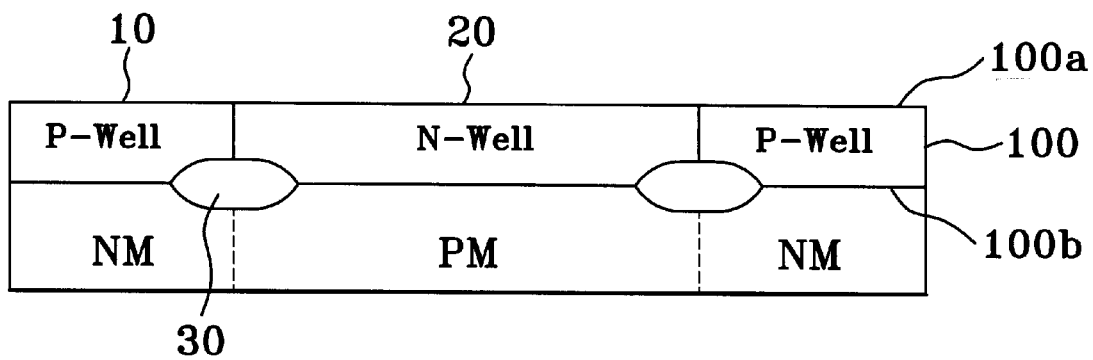
Figure 3C:
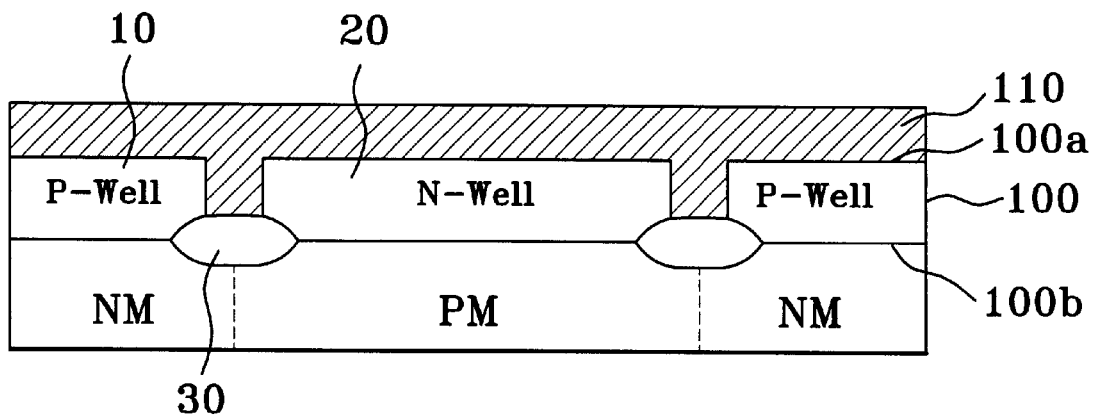

FIG. 3A, 3B, and 3C are cross sectional views describing a method of manufacturing a CMOS device according to one embodiment of the present invention. The reference numbers corresponding to the same portions in the drawings will be used identically.

Referring to FIG. 3A, a semiconductor substrate 100 having a back side 100a and a front side 100b is provided. A P well 10 and a N well 20 are formed in the substrate 100, respectively. In the front side 100b of the substrate 100, a NMOS transistor NM is formed on the P well 10 and a PMOS transistor PM is formed on the N well 20. An isolation layer 30 is formed between the NMOS and PMOS transistors PM and NM.

Referring to FIG. 3B, the back side 100a of the substrate 100 is etched by back-side etching so as to expose PN junction portions on between the P well 10 and the N well 20.

Referring to FIG. 3C, in the back side 100a of the substrate 100, the exposed PN junction portions are etched to expose the isolation layer 30, thereby forming trenches. Thereafter, an insulating layer 110 is formed on the back side 100a of the substrate 100 so as to fill the trenches, thereby isolating the P well 10 and the N well 20.

Figure 4:
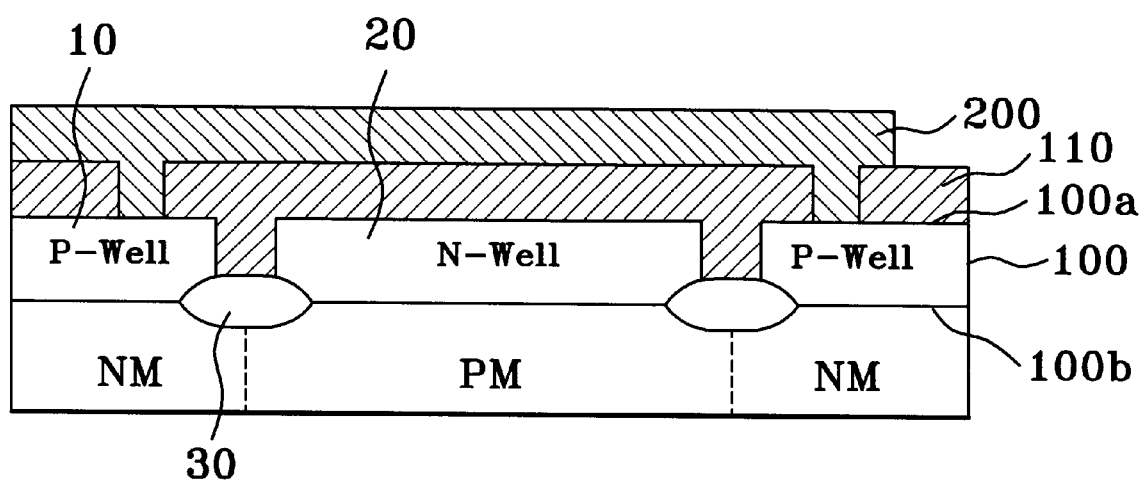
FIG. 4 is a cross sectional view describing a method of forming a metal layer of the CMOS device shown in FIG. 3A, 3B, and 3C.

Referring to FIG. 4, after forming the insulating layer 110 (refer to FIG. 3C), the insulating layer 110 is etched to expose portions of the P well 10, thereby forming contact holes. Next, a metal layer is deposited on the insulating layer 110 to fill the contact holes. The metal layer is then patterned to form an interconnection line 200.

According to the above embodiments, the back side 100a of the substrate 100 is etched, and the trenches are formed in the PN junction portions, respectively. The trenches are then filled with the insulating layer 110, to isolate the P well 10 and the N well, thereby substantially preventing latch-up in a CMOS device.

As described above, the interconnection line 200 is formed on the back side 100a of the substrate 100, so that a process of forming a interconnection line can be easily performed.

While a P well and a N well are isolated by an insulating layer on the back side of a substrate when manufacturing a bulk device as these embodiments, active regions can be isolated by an insulating layer on the back side of a substrate when manufacturing a silicon on insulator(SOI) device.

According to the present invention, a N well and a P well are isolated by an insulating layer on the back side of a substrate, after manufacturing a CMOS device. Therefore, latch-up is effectively prevented in the CMOS device, thereby reducing leakage current. As a result, the properties of the CMOS device are improved.

Although the preferred embodiment of this invention has been disclosed for illustrative purpose, those skilled in the art ill appreciate that various modifications, additions and substitutions are possible, without departing from the scope and spirit of the invention as described in the accompanying claims.

What is claimed is:

1. A method of manufacturing a CMOS device, comprising the steps of:

provinding a semiconductor having a back side and a front side, and including a N well and a P well formed therein respectively, a NMOS transistor formed on the P well, a PMOS transistor formed on the N well;

etching the back side of the substrate along the PN junction portions of the N well and the P well to the front side of the substrate, thereby forming trenches; and, forming an insulating layer on the back side of the substrate to fill the trenches, thereby isolating the P well and the N well.

2. The method according to claim 1, further comprising the steps of:

etching the insulating layer to expose portions of the P well and N well, thereby forming contact holes;

forming a metal layer on the insulating layer to fill the contact holes; and patterning the metal layer to form an interconnection line.

3. A method of manufacturing a CMOS device, comprising the steps of:

providing a semiconductor having a back side and a front side, and including a N well and a P well formed therein respectively, a NMOS transistor formed on the P well, a PMOS transistor formed on the N well, and an isolation layer formed between the NMOS and PMOS transistors;

etching the back side of the substrate to expose PN junction portions between the N well and the P well by back side etching;

etching the exposed PN junction portions to expose the isolation layer, thereby forming trenches; and forming an insulating layer on the back side of the substrate to fill the trenches, thereby isolating the P well and the N well.

4. The method according to claim 3, further comprising the steps of:

etching the insulating layer to expose portions of the P well and N well, thereby forming contact holes;

forming a metal layer on the insulating layer to fill the contact holes; and patterning the metal layer to form an interconnection line.

* * * * *